US007066472B2

(12) United States Patent
Neuhaus

(10) Patent No.: US 7,066,472 B2
(45) Date of Patent: Jun. 27, 2006

(54) CONDUCTIVE SEAL AS WELL AS A METHOD AND APPARATUS FOR ITS PRODUCTION

(75) Inventor: Alexander Neuhaus, Berlin (DE)

(73) Assignee: Neuhaus Elektronik GmbH, Berlin (DE)

( * ) Notice: Subject to any disclaimer, the term of this patent is extended or adjusted under 35 U.S.C. 154(b) by 106 days.

(21) Appl. No.: 10/419,804

(22) Filed: Apr. 22, 2003

(65) Prior Publication Data

US 2004/0012158 A1   Jan. 22, 2004

(30) Foreign Application Priority Data

May 3, 2002   (DE)   .................. 102 21 100

(51) Int. Cl.
 *H05B 6/00*   (2006.01)
 *F16J 15/53*   (2006.01)

(52) U.S. Cl. .................. 277/629; 277/920; 264/464

(58) Field of Classification Search ........... 277/629, 277/919, 920; 264/464
See application file for complete search history.

(56) References Cited

U.S. PATENT DOCUMENTS

| | | | | |
|---|---|---|---|---|
| 3,671,048 A | * | 6/1972 | Gyory et al. | ............... 277/569 |
| 5,045,635 A | * | 9/1991 | Kaplo et al. | ........... 174/35 GC |
| 5,057,363 A | * | 10/1991 | Nakanishi | ................ 428/321.5 |
| 5,354,521 A | * | 10/1994 | Goodman | ................... 264/429 |
| 5,655,781 A | * | 8/1997 | Petrak | ........................ 277/371 |
| 6,635,354 B1 | * | 10/2003 | Bunyan et al. | ............. 428/450 |
| 6,949,270 B1 | * | 9/2005 | Kahl et al. | ................. 427/265 |
| 2005/0225010 A1 | * | 10/2005 | Soulier | ....................... 264/449 |

* cited by examiner

*Primary Examiner*—Alison K. Pickard
(74) *Attorney, Agent, or Firm*—Miles & Stockbridge P.C.

(57) ABSTRACT

A conductive seal that is formed on a first sealing surface by extruding an elastically curing material intermixed with conductive particles is in addition intermixed with magnetic particles. After applying the material to the first sealing surface, its cross section profile is expanded to an adjustable level towards a second sealing surface and/or sealing rims are molded to it by a magnetic force from an electromagnetic plate. The magnetic and conductive particles are preferably concentrated in the marginal sections, particularly due to magnetic forces that act on the sealing roving in the extrusion process.

16 Claims, 3 Drawing Sheets

CONDUCTIVE SEAL AS WELL AS A METHOD AND APPARATUS FOR ITS PRODUCTION

This invention relates to a method and apparatus for producing a conductive seal from an elastically curing material intermixed with conductive particles that is applied from an extruder to a first sealing surface when it is not yet cured, and to a seal produced according to this method.

It is known that electronic components cause electromagnetic noise signals that travel outside via signal conductors through gaps in the housing of these components where they can spread, again through gaps in a receiving housing, to other electronic components and cause damage and malfunctions of these other electronic components.

To prevent these electromagnetic waves that act as a noise signal from escaping from one housing and entering another housing where they can impair the functioning of electronic components, the surfaces that form a gap in the housing (sealing surfaces) are sealed against each other by a conductive seal. The housing that is also conductive acts in conjunction with the conductive seal as a Faraday cage to prevent the emission of electromagnetic waves or shield electronic components from harmful radiation.

In addition to shielding perturbing electromagnetic radiation due to the conductivity of the material used, another major function of such seals is protection of the electronic device against the effects of dust particles, moisture, and toxic gases. The electronic seal thus also has to meet the requirements of a blocking seal commonly used in building and mechanical engineering to prevent transfer of substances between two rooms.

A seal freshly extruded according to the method mentioned above has a generally circular cross section. This cross section is slightly flattened after application onto the sealing surface of a housing part or another base because of its weight and its initial plastic state while the seal is curing. The electronic shielding characteristics of such a seal are sufficient but its elastic properties do not meet the highest sealing requirements as it has a high degree of hardness due to the conductive particles that are distributed across the entire cross section. As these conductive particles are made of silver or a silver-plated material, such seals are also relatively expensive.

DE 197 33 627 proposes an electronic seal that contains less of the expensive silver while retaining its good electronic shielding characteristics and having considerably improved elastic properties for substance blocking. This seal consists of an internal sealing roving of an elastically curing material that does not contain any conductive particles encompassed by a thin conductive coat of a curing material intermixed with conductive particles.

Making a seal from two different materials or mixtures by co-extrusion means higher tool expenses and involves the risk of cracks in the seal due to the distinct separation of the highly elastic internal layer and the less elastic brittle outer layer and their different curing behaviors. Some flattening of the seal during the curing of the internal roving cannot be avoided so that elasticity is reduced and an elastic tight fit of the seal to the opposite sealing surfaces is no longer guaranteed. But to select a different cross section other than circular for this type of electronic shielding seal to produce highly elastic cross sections or portions of cross sections would mean that the effort to design appropriate extrusion tools is either excessive of technologically unfeasible.

The known conductive seals in particular fail to compensate differences in sealing gap height that occur because of manufacturing tolerances in large-scale production as the extruded sealing material is always dimensioned the same for each seal and as any change in diameter would result in higher tool and material costs. It also frequently happens that a greater quantity of sealing material is applied onto the sealing surface at the beginning and end of each extrusion process, i.e. where the two sealing ends abut. The sealing effect of the conductive seal is impaired in both cases.

Sometimes the sealing gap height is so immense that two seals have to be extruded on top of each other onto the sealing surface in two subsequent operating cycles to achieve the required height of the seal. Overlaying two or multiple sealing rovings takes time and increases material costs.

It is therefore the problem of this invention to provide conductive seals of the type mentioned at the outset designed in such a way that high elasticity of the seal is ensured, that tolerance-related variations in the sealing gap height and/or the height of the extruded material at the joint of the two roving ends are compensated, and that safe sealing against substances and electronic shielding are ensured.

This problem is solved according to the invention.

Advantageous improvements and useful embodiments of the invention are described herein after.

The inventive idea of a method for producing a conductive seal consisting of an elastically curing material intermixed with conductive particles that is applied after extrusion, while still in a plastic state, in a generally circular shape onto a sealing surface of a housing is that the elastically curing material is further intermixed with magnetic particles prior to extrusion and that the extruded magnetic sealing roving that adheres to a first sealing surface is attracted by the magnetic forces of an electromagnetic plate located on or above the sealing roving already cured on its outer surface, and thereby deformed. By placing the electromagnetic plate at a specific height above the sealing roving or by lifting the electromagnetic plate that is in contact with the seal and/or by using an electromagnetic plate with a profile that follows the flow of the sealing roving and has the shape of at least one groove, the sealing roving that adheres to the first sealing surface but is still plastic inside is expanded towards the electromagnetic plate and/or an opposite second sealing surface. The elasticity of a seal produced in this way is considerably improved by stretching the generally round cross section perpendicular to the longitudinal direction of the sealing roving, and especially by forming a sealing rim in correspondence with the profile of the electromagnetic plate. As the electromagnetic plate can be adjusted in height or set to a specific level above the first sealing surface, the height (expansion) of the seal can be adjusted to manufacturing conditions. The method cannot only be used to compensate tolerances in the sealing gap height but also height variation in the sealing roving. Another important advantage is that there is no more need to apply a particularly thick roving for filling a very great sealing gap and achieving the required seal height when extruding or to stack multiple rovings; all there is to do is to stretch a single layer to the required height. This reduces the manufacturing effort and material consumption.

It goes without saying that the term extrusion refers to any kind of dispensing the sealing material in a plastic state onto a sealing surface using pressure. This means that the sealing material can be fed to a nozzle or an extruder head using a worm extruder, a reciprocating pump, a gear pump, just compressed air and the like.

In an advantageous improvement of the invention, the magnetic and the conductive particles are rolled into one-piece particles, i.e. the magnetic iron or nickel particles (or particles made of another magnetic material) are coated with a conductive layer. In the extrusion process, these particles can be drawn to the rim area of the extruded sealing roving by applying magnetic forces to increase conductivity in the rim of the seal and create a homogeneous transition between the highly elastic inner portion and the conductive outer portion of the seal. As the portion of elastically curing material is low in the perimeter rim area of the extruded sealing roving, the outer surface hardens fast so that it can easily be removed from the electromagnetic plate after the sealing roving was stretched or a sealing rim was molded onto it. The single-piece conductive and magnetic particles can also be made entirely of nickel, which is both conductive and magnetic. In addition to the separate or single-piece magnetic and conductive particles, the sealing material may also contain single-piece conductive and magnetic particles plus conductive non-magnetic particles. The conductive magnetic particles may be fibers or laminas.

It is also conceivable that an internal roving made of elastically curing material free from magnetic and conductive particles and coated with a thin coat of elastically curing material intermixed with conductive and magnetic particles is applied to the first sealing surface by co-extrusion. Using magnetic particles encompassed by a conductive layer in co-extruded outer conductive coat is advantageous in this case, too. A very low portion of magnetic particles can be mixed into the inner roving.

As a further improvement of the invention, the electromagnetic plate may be divided into individual magnetic segments that can be activated separately to apply different deforming forces and variably stretch the cross section. It is finally conceivable that the sealing roving can be deformed sideways using an electromagnetic plate that is located laterally to the housing/sealing roving. The sealing roving can also be extruded as a hollow body whose shape is either retained or modified after extrusion by the magnetic forces.

The invention is not only applicable in the sector of shielding seals but can also be used to deform other seals curing on a sealing surface.

Embodiments of the invention will be explained in more detail with reference to the attached figure, wherein it is assumed that the treatment according to the invention for improving elasticity and for compensating tolerances refers to a seal with accumulated conductive particles in its peripheral area. Wherein.

Figure 1:
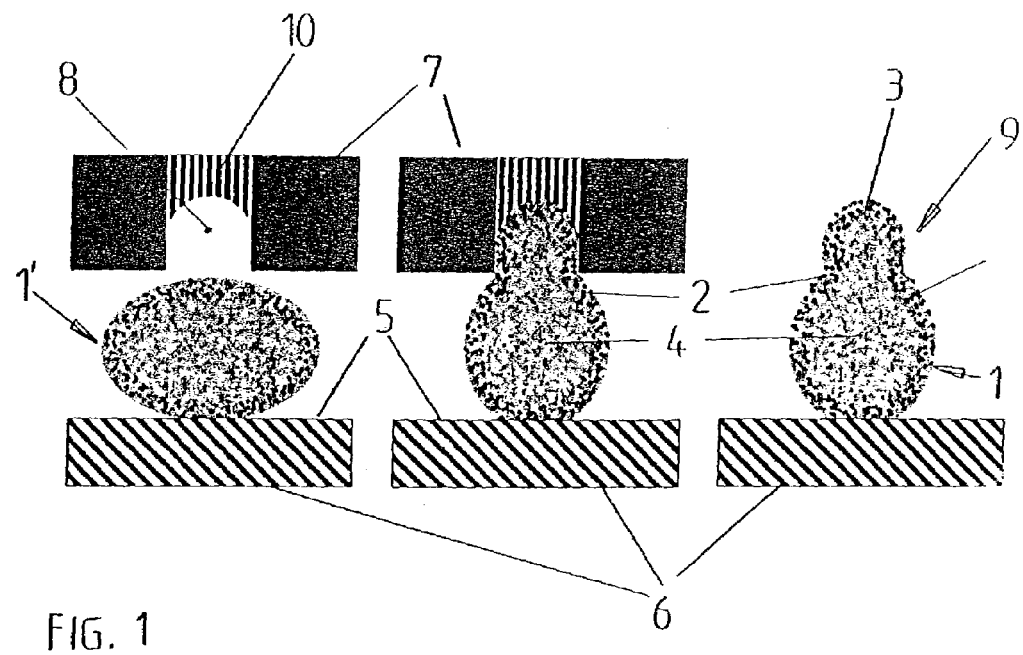
FIG. 1 is a schematic view of the seal production process according to the invention using an electromagnetic plate that has an approximately semicircular profile on its bottom side that follows the flow of the sealing material and along which electromagnets are located.

Each of the seals 1 or each of the sealing rovings 1' shown in FIGS. 1 to 5 consists of a material that cures elastically at room temperature or at a higher temperature or when exposed to ultraviolet radiation (here, a silicone) and that is intermixed with conductive magnetic particles 2. The conductive magnetic particles 2 in this embodiment are made of nickel or iron and coated with a silver layer so that they have both magnetic properties and high conductivity. The conductive magnetic particles 2 are concentrated in the rim section of the seal 1/the sealing roving 1' thus forming an excellently conductive and magnetic outer ring 3 and an inner roving 4 that is mainly free from conductive magnetic particles 2. This distribution of the conductive magnetic particles is achieved according to the invention by running the sealing material intermixed with the conductive magnetic particles 2 and still in its plastic state prior to or after extrusion through an annular magnetic group located at or around the extrusion head of an extruder (not shown). In this way, most of the conductive magnetic particles are drawn into the rim section of the seal 1 to form the narrow outer ring 3 enriched with conductive magnetic particles 2 while the inner roving 4 becomes either totally free from conductive magnetic particles 2 or contains only a small portion thereof.

Deviating from the embodiment described above, it is also conceivable that the enriched rim area is produced in a known way by co-extrusion of a material intermixed with conductive and magnetic particles and a material free from conductive and magnetic particles wherein the material intermixed with conductive particles forms a magnetic roving that coats the inner roving which is free from conductive particles.

In particular, it is possible that the sealing roving is homogeneously intermixed with conductive and magnetic particles across its entire cross section, or that the inner roving contains a smaller portion of the required total quantity of conductive and magnetic particles that are drawn towards the outer rim section by the magnetic forces that act during extrusion.

The freshly extruded sealing roving 1' for the seal 1 is applied while still in a plastic state onto a first sealing surface 5 of the lower housing part 6 that, together with an upper housing part with a second sealing surface (not shown), forms a housing with a sealing gap of a specific height between the two housing halves. According to FIGS. 1 to 4, the freshly extruded sealing roving 1' for the seal 1 initially has a circular and, after being applied onto the first sealing surface 5, a somewhat flattened cross section. The outer surface of the sealing roving 1' that hardens first bonds in its still plastic state after extrusion with the sealing surface 5 of the housing part 6, but cures fast as the curing parameters such as room temperature and humidity, UV radiation or raised temperature are effective here first and the portion of material to be cured is relatively low due to the particles incorporated in it. The sealing roving 1' can be exposed to short-term heat or UV radiation to cause the outer surface of the seal to harden as fast as possible when curing takes place at increased temperature or under UV radiation.

When the sealing roving 1' has been applied onto the sealing surface 5, an electromagnetic plate 7 is moved over the lower housing part 6 and positioned directly on or at a specific distance above the sealing roving 1'. A profile 8 that has the shape of one or more grooves is recessed into the bottom side of the electromagnetic plate 7 that faces the seal 1, and a multitude of solenoids 10 is arranged one after the other in that profile 8 that can be activated individually or in groups. The orientation of the profile 8 in the electromagnetic plate 7 matches that of the seal 1 or the sealing roving 1' on the revolving sealing surface 5. The set height level of the electromagnetic plate 7 plus the depth of the profile 8 match the height of the finished expanded and/or profiled seal 1 which is based on the respective height of the sealing gap.

The profile 8 of the electromagnetic plate 7 shown in FIGS. 1 to 4 is optional, which means that the electromagnetic plate 7 may be completely even on its bottom side. In this case, however, the electromagnetic plate 7 has to be positioned at a specific distance above the sealing roving 1' to stretch the sealing roving 1' and change its profile in doing so.

The electromagnetic plate 7 is now connected to a power source (not shown) for a short time. The magnetic sealing material is drawn onto the electromagnetic plate 7 or onto/into the profile 8 on its bottom side because of the magnetic particles 2 that are contained in the still plastic and deformable sealing roving 1', i.e. the silver-coated magnetic particles embedded in the curing mold, and because of the magnetic forces of attraction the solenoids 10 of the electromagnetic plate 7 apply to these particles. As FIGS. 1 to 4 show, a specific height of the seal 1 can be set, meaning that the sealing roving 1' for the seal 1 can be stretched upwards and thus made more elastic, and a specific higher elastic profile can be molded in the section of the seal 1 that faces the sealing surface on the opposing housing part. This molding is possible because at that time only the surface area of the sealing roving 1' has hardened but is still sufficiently flexible to give way to the molding forces while the major portion of the elastically curing sealing material is still plastically formable and the magnetic particles 2 are bound in the rim area (outer ring 3).

After setting the height and shaping (stretching and profiling) of the sealing roving 1', the electromagnetic plate 7 is detached from the finished seal 1. The electromagnetic plate 7 can be easily detached from the finished seal 1 as at least the surface of the seal was hardened during shaping and was only kept on the electromagnetic plate 7 by the magnetic forces. The seal 1 is sufficiently hardened at the time when the electromagnetic plate 7 is detached that it keeps the shape it has been molded into by the magnetic forces. If the material cures under the influence of heat, the electromagnetic plate 7 may supply heat to accelerate the curing of the sealing material and to stabilize the shaping by the magnetic forces.

Figure 2:
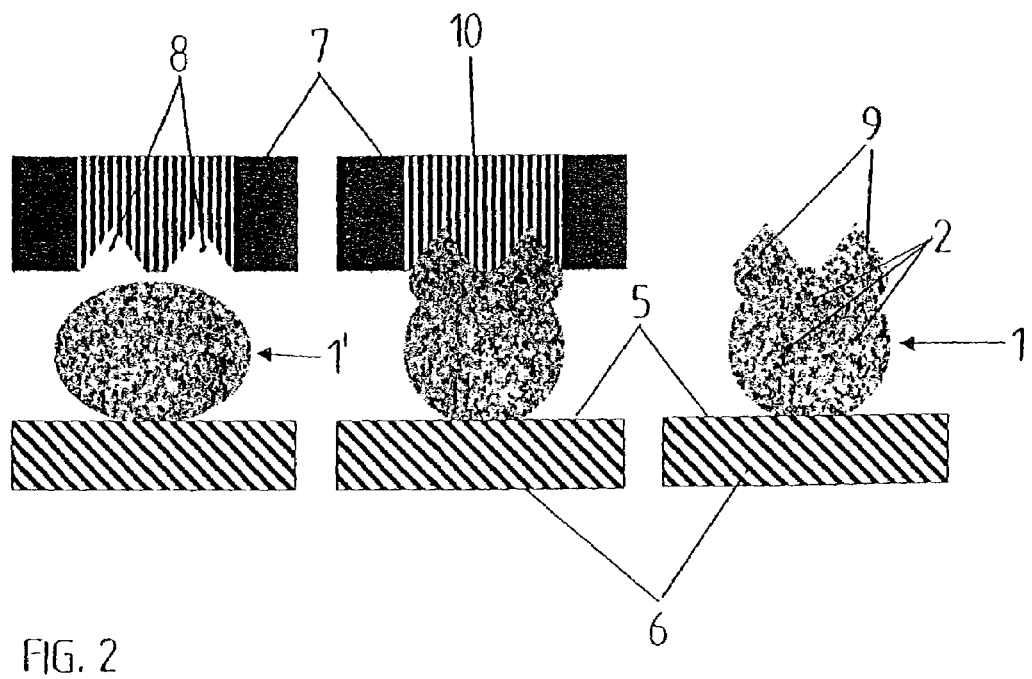
FIG. 2 shows the method according to FIG. 1, here however the electromagnetic plate has two profile grooves to mold a sealing roving with two adjacent sealing rims.

The left half of FIG. 1 shows a freshly extruded sealing roving 1' and an electromagnetic plate 7 positioned very closely above it. The profile 8 on the bottom side of the electromagnetic plate 7 is an approximately semicircular groove. The central part of FIG. 1 shows the seal 1 while it is drawn onto the electromagnetic plate 7 or into the profile 8. The right-hand part of the figure shows the finished seal 1 that has the predefined (expanded) height and the narrower and therefore higher elastic upper portion (sealing rim 9). A comparable embodiment with two adjacent and mainly tapered sealing rims 9 is shown in FIG. 2. Here the profile 8 in the electromagnetic plate 7 (or the solenoid 10) consists of two triangular notches.

A drop shape with a tapering on top (not shown) can also be produced using an electromagnetic plate 7 with an even bottom side (without a profile groove) that is positioned at a certain distance above the extruded and still round sealing roving 1'. Unlike these embodiments, the electromagnetic plate 7 with a profile 8 may also be placed directly onto the seal to just cause stretching of the molded-on sealing rim 9. It is also conceivable to lower the electromagnetic plate to produce a flattened form of the seal 1, with or without a sealing rim, or to stretch the cross section in its height by lifting the electromagnetic plate that is placed directly on the sealing roving 1'.

Figure 3:
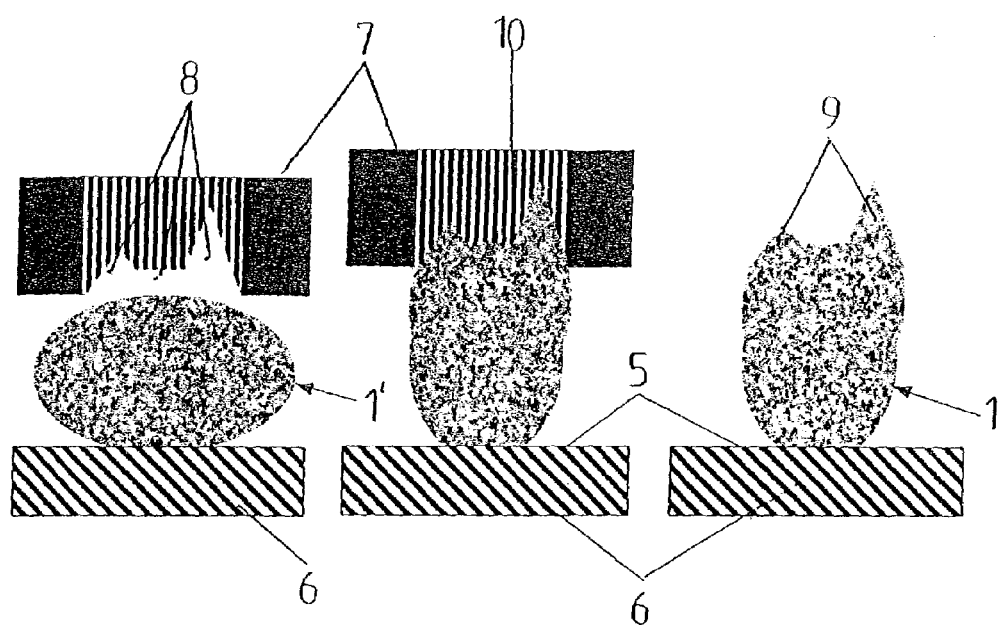
FIG. 3 shows another design of the profile groove in the electromagnetic plate to produce seals with differently shaped sealing rims.
Figure 4:
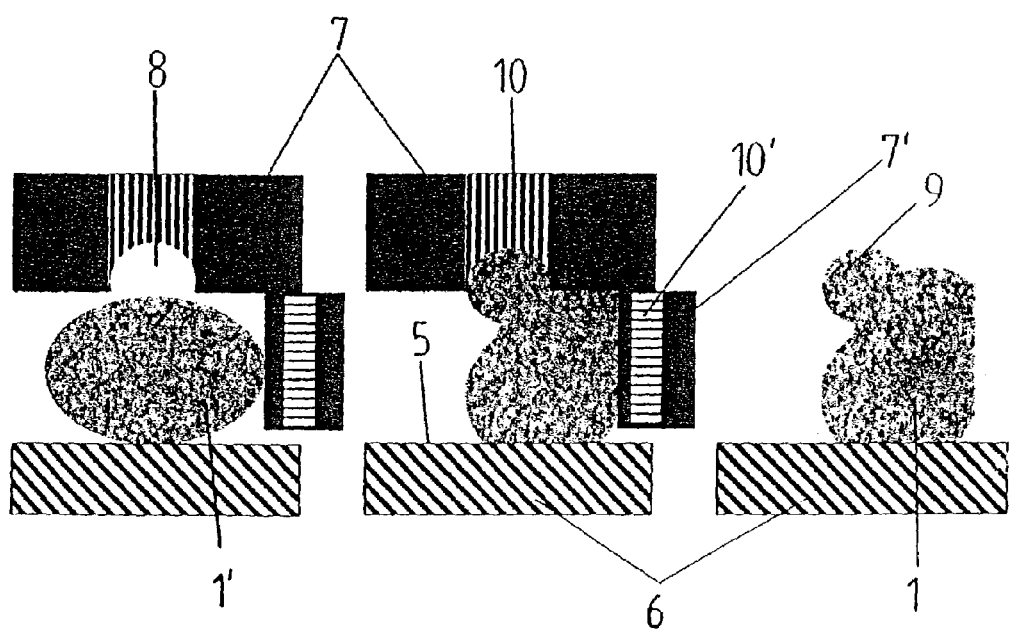
FIG. 4 shows yet another variant of the method in which the sealing roving is expanded by an approximately circular seal part and the cross section is deformed sideways using a laterally placed magnetic plate.
Figure 5:
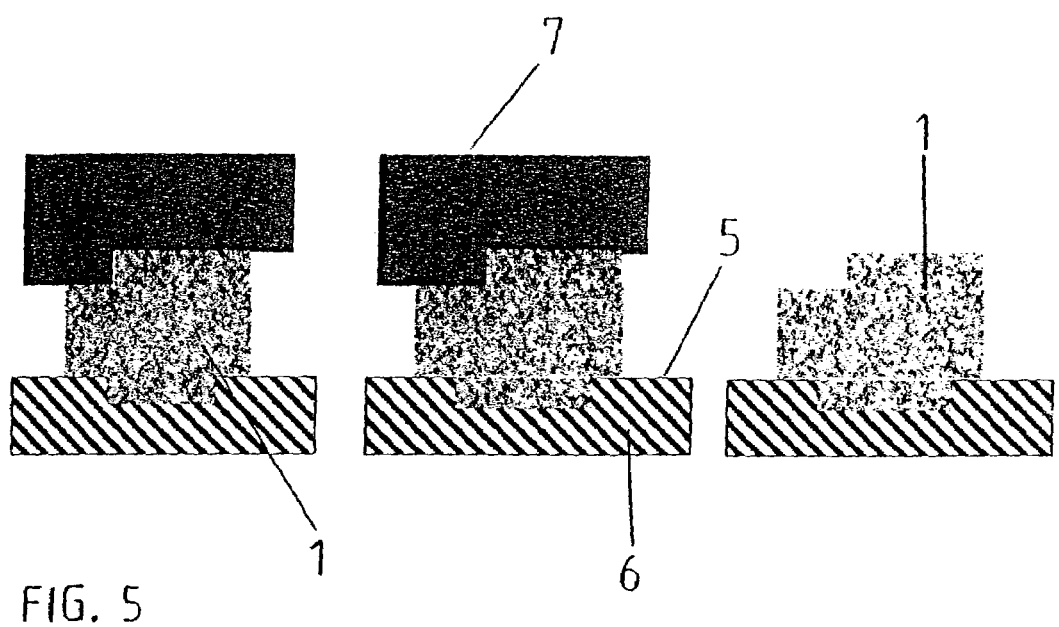
FIG. 5 shows still another variant of the method in which an approximately square sealing roving is deformed by the pressure from a profiled electromagnetic plate.

FIGS. 3, 4 and 5 show other embodiments of producing a seal 1 with one or two sealing rims 9 having varying profiles, wherein the seal is stretched upwards to the height of the sealing rim(s) 9, not only to increase the elasticity of the seal in this section by stretching and profiling the sealing roving 1' but also to compensate differences in height resulting from applying the sealing material and from the housing to be sealed, to be able to define a uniform height of the seal 1 and to achieve this predefined great height without stacking two or more extruded sealing rovings on top of each other and thus reduce material consumption.

FIG. 4 shows another embodiment of the invention wherein not only the height of the cross section is increased and a sealing rim molded to the seal but the cross section of the sealing roving 1' is influenced in lateral direction by a movable electromagnetic plate 7' with solenoids 10' that is placed sideways from the roving.

In the embodiment shown in FIG. 5 the electromagnetic plate is designed with a step in its bottom to a rectangular or otherwise shaped sealing roving 1' to the electromagnetic plate 7 and to produce a specific stepped seal 1. In the same way, this electromagnetic plate 7 can be pressed onto the sealing roving 1' to cause the sealing roving 1' to stretch sideways and to produce a seal 1 that is flattened and profiled accordingly.

LIST OF REFERENCE SYMBOLS

1 Seal
1' Extruded sealing roving
2 Magnetic particles, conductive particles
3 Conductive magnetic outer ring
4 Inner roving without conductive means
5 First sealing surface
6 Housing part (with first sealing surface)
7 Electromagnetic plate
7' Lateral electromagnetic plate
8 Profile (indentation/protrusion/step)
9 Sealing rims
10 Solenoid (segment)
10' Solenoid (segment)

The invention claimed is:

1. A method for producing a conductive seal made of an elastically curing material intermixed with conductive particles that is directly applied from an extruder onto a first sealing surface while still in its plastic state, characterized in that magnetic particles are intermixed with the sealing material prior to or after extrusion and that, after the sealing material has been applied onto a first sealing surface (5) and subsequent curing of just a surface layer, a magnetic field is generated over a specific period of time using an electromagnetic plate (7) placed above the extruded sealing roving (1') and the sealing roving (1') that adheres to the sealing surface (5) is stretched towards the electromagnetic plate (7) and molded into the finished seal (1) due to the action of the magnetic forces on the magnetic particles.

2. The method according to claim 1, characterized in that the electromagnetic plate (7) is set to a level above the sealing roving (1') extruded onto the sealing surface (5) that corresponds to the height of the sealing gap, and that the cross section of the sealing roving (1') is stretched to this height to form the finished seal (1).

3. The method according to claim 1, characterized in that the electromagnetic plate (7) is placed upon the extruded sealing roving (1') and that its cross section is set to a specific uniform height of the finished seal (1) by a limited upward motion of the electromagnetic plate (7).

4. The method according to any one of claims 1 through 3, characterized in that the sealing roving (1') is applied as a one-layer coat onto the sealing surface (5) and stretched to the height required to fill the sealing gap.

5. The method according to any one of claims 1 through 3, characterized in that a groove-like profile (8) that correspond to the orientation of the seal (1) and is cut into the electromagnetic plate (7) magnetically molds elastic sealing rims (9) in the free sealing section of the seal (1) that faces an opposite second sealing surface.

6. The method according to any one of claims 1 through 3, characterized in that the sealing material cures elastically at room temperature or at increased temperature or when exposed to UV radiation.

7. The method according to claim 6, characterized in that the heat for a material curing at increased temperature is supplied by the electromagnetic plate (7).

8. The method according to any one of claims 1 through 3, characterized in that the magnetic forces or a vacuum hold the seal (1) that is magnetically stretched and deformed on the electromagnetic plate (7) until it reaches dimensional stability.

9. The method according to any one of claims 1 through 3, characterized in that single-piece particles coated with a conductive layer, or nickel particles that are both conductive and magnetic, or conductive magnetic and conductive non-magnetic particles are intermixed with the sealing material prior to extrusion.

10. The method according to claim 9, characterized in that the conductive layer is made of silver and the magnetic particles are made of iron, nickel, or another magnetic material.

11. The method according to any one of claims 1 through 3, characterized in that, to achieve excellent conductivity and magnetic effect and to reduce material consumption, the single-piece conductive and magnetic particles are concentrated along the perimeter of the seal (1) extruded onto the sealing surface (5) by generating magnetic forces section by section and at independent times that draw the conductive and magnetic particles towards the outer rim of the seal to create a conductive and magnetic rim section and a highly elastic inner roving.

12. The method according to any one of claims 1 through 3, characterized in that a sealing material intermixed with single-piece conductive and magnetic particles and a sealing material that is free from conductive and magnetic particles are applied by co-extrusion as a sealing roving (1'), and in that the sealing material intermixed with conductive and magnetic particles encompasses the sealing material without additives like a coating.

13. The method according to claim 12, characterized in that a reduced portion of conductive magnetic particles is added by mixing to the outer roving and the remaining conductive and magnetic particles that are magnetically drawn to the outer rim during extrusion are added by mixing to the inner roving to reduce extrusion pressures.

14. The method according to any one of claims 1 through 3, characterized in that conductive and magnetic particles in the form of fibers or laminas are used.

15. The method according to any one of claims 1 through 3, characterized in that the sealing roving (1') is applied to the sealing surface as a hollow roving and that the cross sectional profile is held, expanded, and/or profiled further by the magnetic forces of the electromagnetic plate.

16. The method according to any one of claims 1 through 3, characterized in that the cross sectional surface of the sealing roving (1') is deformed by the magnetic forces of a laterally positioned movable electromagnetic plate (7').

* * * * *